(12) United States Patent
Leuciuc et al.

(10) Patent No.: US 8,902,093 B1
(45) Date of Patent: Dec. 2, 2014

(54) PARALLEL ANALOG TO DIGITAL CONVERTER ARCHITECTURE WITH CHARGE REDISTRIBUTION AND METHOD THEREOF

(71) Applicant: Cadence Design Systems, Inc., San Jose, CA (US)

(72) Inventors: Adrian Luigi Leuciuc, Frederick, MD (US); William Pierce Evans, Catonsville, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 12 days.

(21) Appl. No.: 13/706,025

(22) Filed: Dec. 5, 2012

(51) Int. Cl.
*H03M 1/00* (2006.01)
*H03M 1/12* (2006.01)

(52) U.S. Cl.
CPC .................................... *H03M 1/1245* (2013.01)
USPC ........... 341/122; 341/118; 341/414; 341/155; 341/172

(58) Field of Classification Search
CPC ....... H03M 1/486; H03M 1/46; H03M 1/806; H03M 1/06; H03M 1/442; H03M 1/462; H03M 1/474; H03M 1/403; H03M 1/466
USPC .......... 341/118, 120, 122, 141, 142, 155, 172
See application file for complete search history.

(56) References Cited

U.S. PATENT DOCUMENTS

| | | | | |
|---|---|---|---|---|
| 5,416,432 A | * | 5/1995 | Lewis et al. | 327/60 |
| 6,025,794 A | * | 2/2000 | Kusumoto et al. | 341/172 |
| 6,160,508 A | * | 12/2000 | Gustavsson et al. | 341/155 |
| 6,788,240 B2 | * | 9/2004 | Reyneri et al. | 341/159 |
| 7,015,729 B1 | * | 3/2006 | Tursi et al. | 327/94 |
| 8,217,815 B2 | * | 7/2012 | Chen et al. | 341/143 |
| 8,279,101 B1 | * | 10/2012 | Stevenson | 341/155 |
| 8,350,740 B2 | * | 1/2013 | Akita | 341/122 |
| 8,525,556 B2 | * | 9/2013 | Singh et al. | 327/94 |
| 2007/0188367 A1 | * | 8/2007 | Yamada | 341/155 |
| 2009/0128391 A1 | * | 5/2009 | Bailey et al. | 341/172 |
| 2011/0090024 A1 | * | 4/2011 | Chen et al. | 333/174 |
| 2011/0241912 A1 | * | 10/2011 | Doris et al. | 341/110 |
| 2012/0207247 A1 | * | 8/2012 | Cheng | 375/340 |
| 2013/0265182 A1 | * | 10/2013 | Johancsik et al. | 341/122 |

OTHER PUBLICATIONS

Greshishchev et al; "A 40GS/s 6b ADC in 65nm CMOS"; ISSCC 2010 Digest of Technical Papers pp. 390-392.

* cited by examiner

*Primary Examiner* — Linh Nguyen
(74) *Attorney, Agent, or Firm* — Rosenberg, Klein & Lee

(57) ABSTRACT

An analog to digital converting system (200) includes an analog to digital converter (ADC) circuit that is formed by a plurality of parallel ADCs (ADC 1 ADC N) for continuous sequential processing of an input analog voltage signal. Each of the ADCs is a type that employs a capacitor digital to analog converter (DAC) (209, 701) therein. The system further includes a sample and hold circuit (220) coupled to the parallel ADCs by a conductive interconnect wiring pattern (203). The sample and hold circuit includes a sampling switch (207) and a hold capacitance formed by the parallel combination of a hold capacitor (205) and the distributed parasitic capacitance (204) of the conductive interconnect wiring pattern (203). During the hold phase of the sample and hold circuit, charge is redistributed from the hold capacitance to all of the capacitors (211) of the capacitor DAC, which serve as a secondary hold capacitance.

20 Claims, 9 Drawing Sheets

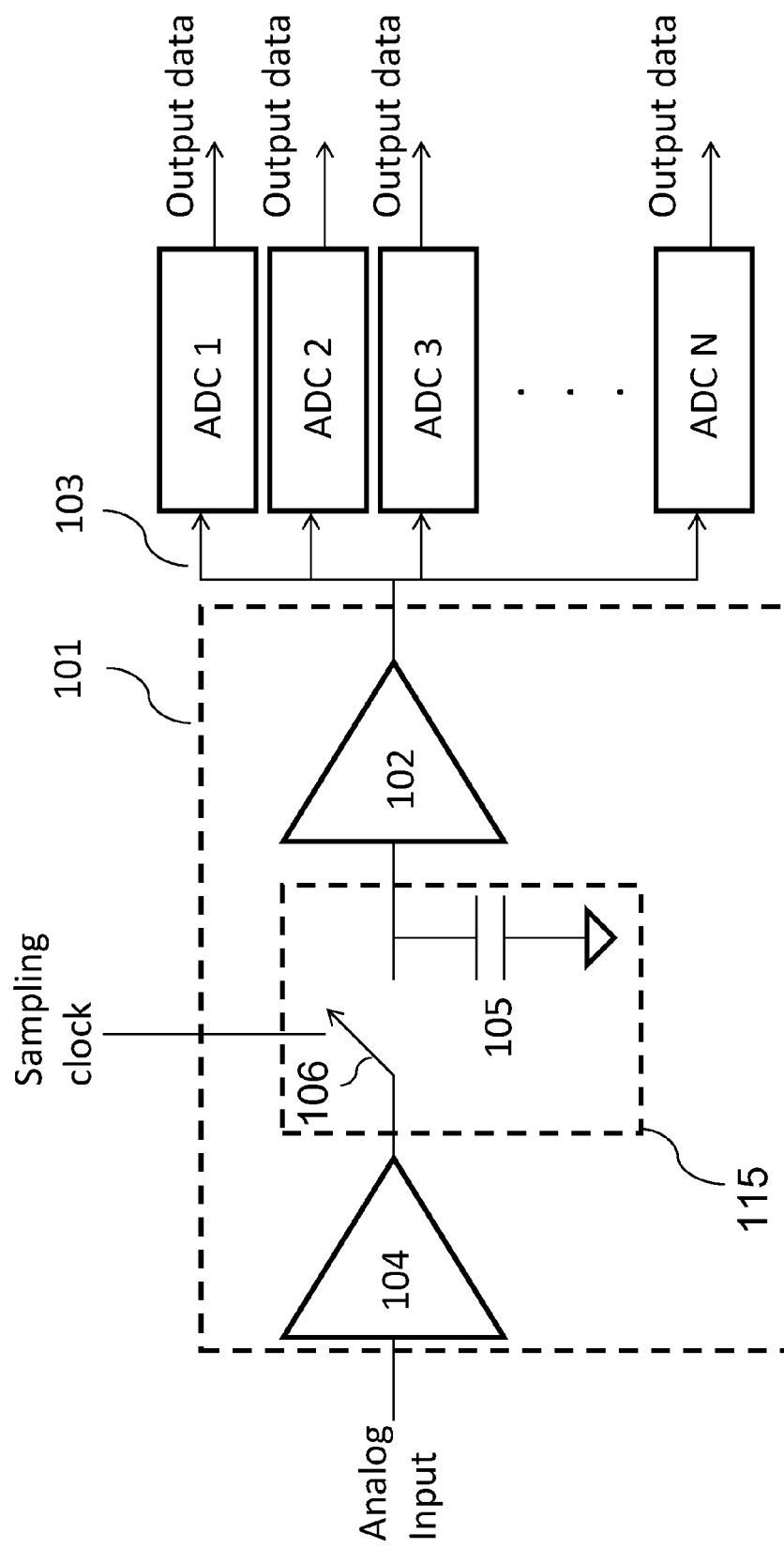

US 8,902,093 B1

PARALLEL ANALOG TO DIGITAL CONVERTER ARCHITECTURE WITH CHARGE REDISTRIBUTION AND METHOD THEREOF

BACKGROUND OF THE INVENTION

1. Field of the Invention

This disclosure directs itself to an analog to digital converting system incorporating a charge redistribution sampler. In particular, the disclosure is directed to an analog to digital converting system having a plurality of analog to digital converters with each incorporating a switched capacitor digital to analog converter and a conductive interconnect wiring pattern connecting inputs of the plurality of analog to digital converters in parallel, where the capacitors of the switched capacitor digital to analog converter of each sequentially selected analog to digital converter function as a secondary hold capacitance for charge from the hold capacitance of the sample and hold circuit to be redistributed thereto. More in particular, the disclosure pertains to an analog to digital converting system having a plurality of analog to digital converters and a sample and hold circuit that is devoid of an output buffer and having a hold capacitance formed by a parallel combination of a distinct hold capacitor and the distributed parasitic capacitance of the conductive interconnect wiring pattern connecting the plurality of analog to digital converters. During each hold phase of the sample and hold circuit, the charge on the hold capacitance is transferred to the capacitors of a capacitor digital to analog converter of a successive one of the plurality of analog to digital converters and then secondarily sampled for processing by that analog to digital converter while the sample and hold circuit begins the next sample phase. Further, the disclosure relates to an analog to digital converting system having a plurality of parallel analog to digital converters, each incorporating a switched capacitor digital to analog converter and a conductive interconnect wiring pattern connecting inputs of the plurality of analog to digital converters in parallel. The system includes a sample and hold circuit having a sampling switch operatively coupled to a hold capacitance formed by the parallel combination of a distinct hold capacitor and the distributed parasitic capacitance of the conductive interconnect wiring pattern. With each succeeding sampled voltage impressed upon the hold capacitance, charge is redistributed to the switched capacitor digital to analog converter of a successive one of the plurality of the analog to digital converters. The charge transferred to the switched capacitor digital to analog converter is secondarily sampled and then processed conventionally by the analog to digital converter. Additionally, the disclosure is directed to a charge redistribution sampling method for a high speed analog to digital converter circuit. The method continuously performs the steps of:

operating a sampling switch during a first time period to connect the hold capacitance to the analog signal input to charge the hold capacitance to a sampled voltage value;

following the first time period, operating at least one reset switch of one of a plurality of parallel analog to digital converters for a second time period to discharge at least one secondary hold capacitor thereof;

following the first time period, operating at least one bias supply switch of the one of the plurality of analog to digital converters for a third time period, the third time period being greater than the second time period and a portion of the third time period being concurrent with the second time period; and following the second time period and concurrently with a portion of the third time period operating at least one secondary sampling switch of the one of the plurality of analog to digital converters to transfer the charge on the hold capacitance to the at least one secondary hold capacitor of the one of the plurality of analog to digital converters.

2. Prior Art

The requirements of today's high performance communication systems require high-speed, high-resolution, and power efficient analog to digital converters (ADCs). This requirement also leads to an increased demand for high-speed and high-resolution sampling systems which provide the analog input to an ADC. One solution to this problem that has been widely used has been the use of parallelism to divide the information of the analog input signal into several parallel channels, converting them independently in a time interleaved manner to provide digital output signals of the samples processed by each channel.

In a time-interleaved ADC architecture, each channel in a system of a plurality of parallel channels alternately, in turn, processes a sample. By that arrangement, the sampling frequency of any one channel does not need to fulfill the Nyquist criterion. However, the sample and hold circuit that provides the samples to the plurality of parallel channels must operate at an overall sampling frequency that fulfills the Nyquist criterion. The multiple channels of the ADC can be realized in different converter technologies to achieve design criteria with respect to a required data rate, resolution and power consumption.

While parallel ADCs allow for an increase in the effective sample rate, as compared with an individual ADC, they require all of the converters to be closely matched in gain, offset, sampling aperture time and sampling bandwidth. As shown in FIG. 1, to achieve high sampling accuracy between the multiple parallel ADCs, ADC 1-ADC N, a single high speed sampler 101 is connected in front of the parallel ADCs. The sampler 101 includes an input buffer 104 supplying the analog input to a sample and hold circuit 115. The output of the sample and hold circuit 115 is buffered by an output buffer 102 and distributed to the multiple converters ADC 1-ADC N by a conductive interconnect wiring pattern 103. The output buffer must be a high speed buffer since it must operate at the sampling frequency of the sampling switch 106.

Time-interleaved successive approximation register based (SAR) ADCs are considered ideally suited to high-speed medium to high resolution applications due to their highly scalable architecture and due to the improvements in matching and density in the forming of capacitors that has been achieved using sub-micron processing. Thus, as shown in FIG. 1A, the prior art parallel ADC of FIG. 1 is illustrated as a time-interleaved parallel SAR ADC. The architecture and operation of SAR ADCs are well known and therefore only those portions thereof that are necessary to understand that which is being disclosed herein will be discussed in detail. Such SAR ADCs make use of a digital to analog converter (DAC) which is often constructed using a capacitive network DAC incorporating multiple switched capacitors, a comparator and SAR logic. The multiple switched capacitors are often sized to have capacitance values that a weighted in correspondence to the binary value of the digital "bit" being represented. For simplicity of the drawing of FIG. 1A, only one of the multiple switched capacitor sections 108 of the capacitor network of the ADCs ADC 1-ADC N are schematically illustrated and it should be understood that each of the parallel ADCs includes multiples of the section 108, all connected to the conductive interconnect wiring pattern 103.

Referring additionally to FIG. 1B, each time the sample clock goes to a "high" logic level, the sampling switch 106 closes to connect the hold capacitor 105 to the voltage at the analog input through the input buffer 104. The hold capacitor 105 charges to substantially the voltage value at the analog input, as a function of the RC time constant of the input circuit, during the sample time period (the time period the sample clock is at a high logic level). When the sample clock goes to a "low" logic level, the sampling switch opens and the charge on hold capacitor 105 is held for transfer to one of the parallel ADCs ADC 1-ADC N. Assuming ADC 1 is the ADC to process the currently sampled voltage stored on hold capacitor 105, the switches 109 and 110 of ADC 1 close responsive to timing signals ph1a and ph1, respectively. Switch 110 connects one terminal of capacitor 111 to a reference voltage, bias1, which may at a particular bias potential or "ground" potential. Switch 109 connects the opposing terminal of capacitor 111 to the conductive interconnect wiring pattern 103 and thereby to the output buffer 102 of sampler 101 to transfer charge from hold capacitor 105. The operation of the switches connecting the opposing terminal of capacitor 111 to the reference potentials ref_p and ref_m are operated in accordance with conventional SAR ADC logic, and as such not being described herein.

During the next excursion of the sample clock signal to a high logic level, the sampling switch 106 again closes to sample the analog voltage value then present at the analog input of the sampler 101 and charge hold capacitor 105 to the newly sampled value. During the next hold time period that follows, the charge on hold capacitor is transferred to the next ADC in the sequence, for example an ADC 2 (not shown). All of the parallel ADCs are identical to the above described ADC 1 and their respective operation proceeds identically in accordance with corresponding timing signals. As the sampling continues, eventually the switched capacitor sections 108 of the last of the parallel ADCs, ADC N, will be operated, closing switch 109 of ADC N to connect the corresponding capacitor 111 to the conductive interconnect wiring pattern 103 and transfer charge from the hold capacitor 105 thereto. On the next transition of the sample clock to a high logic level, the sequence of processing the transferred sampled voltages repeats through ADC 1-ADC N.

There are several main disadvantages of this prior art approach. One disadvantage results from the sampled voltage having to be distributed to the multiple ADCs, requiring the high speed output buffer 102 to be capable of settling within one high speed clock cycle to the accuracy required by the ADC. Another related issue is that the conductive interconnect wiring pattern 103 distributing the sampled voltage signal can have significant parasitic capacitance and resistance if there are a large number of parallel ADCs. The output buffer 102, in order to drive the high capacitive load at high speed, must be a high power device and is often the highest power block in the parallel ADC architecture, which also complicates the integrated circuit design and consumes a large amount of chip area. This prior art architecture also has a significant disadvantage at the design stage. The design and simulation of the sample and hold output buffer 102 is a labor intensive task and cannot be finalized until the full ADC load is assembled so all interconnects and loading can be modeled with interconnect parasitic capacitance and resistance. Often, the output buffer has to be redesigned and/or modified during the simulation phase of the design process to drive this very difficult load at high speed with fast settling.

SUMMARY OF THE INVENTION

An analog to digital converting system is provided which uses a charge redistribution sampler. The system includes an analog to digital converter circuit. The analog to digital converter circuit includes a plurality of analog to digital converters with each incorporating a switched capacitor digital to analog converter. The system further includes a conductive interconnect wiring pattern connecting inputs of the plurality of analog to digital converters in parallel. The conductive interconnect wiring pattern has a distributed parasitic capacitance. Further, the system includes a sample and hold circuit coupled to an input terminal for periodically sampling an analog voltage applied to the input terminal. The sample and hold circuit includes a hold capacitance connected to the conductive interconnect wiring pattern and a sampling switch coupled between the input terminal and the hold capacitance for coupling an analog voltage at the input terminal to the hold capacitance responsive to a sampling clock signal. As a result, the hold capacitance charges to a sampled voltage value corresponding to the analog voltage. The hold capacitance is formed by a combination of the hold capacitor of the sample and hold circuit and the distributed parasitic capacitance. The sampled voltage value held on the hold capacitance is secondarily sampled by the analog to digital converter circuit.

From another aspect, a charge redistribution sampling method for a high speed analog to digital converter circuit is provided. The method includes the steps of providing a sampling switch coupled to an analog signal input, and providing an analog to digital converter circuit formed by an N number of analog to digital converters coupled in parallel to the sampling switch by a conductive interconnect wiring pattern. The value of N is an integer greater than 1. The method also includes the step of forming a hold capacitance connected to the conductive interconnect wiring pattern. The hold capacitance is formed by a parallel combination of a distinct capacitor and a distributed parasitic capacitance of the conductive interconnect wiring pattern. The method includes the steps of providing each of the analog to digital converters with at least one secondary sampling switch connected to the conductive interconnect wiring pattern, and providing each of the analog to digital converters with at least one secondary hold capacitor connected to the at least one secondary sampling switch. Further, the method includes the steps of providing each of the analog to digital converters with at least one reset switch coupled between one terminal of the at least one secondary hold capacitor and a first reference voltage, and providing each of the analog to digital converters with at least one bias supply switch coupled between an opposing terminal of the at least one secondary hold capacitor and a second reference voltage.

The method additionally includes the step of operating the sampling switch during a first time period to connect the hold capacitance to the analog signal input to charge the hold capacitance to a sampled voltage value. Following the first time period, the at least one reset switch of one of the N number of analog to digital converters is operated for a second time period to discharge the at least one secondary hold capacitor. Further, following the first time period, the at least one bias supply switch of the one of the N number of analog to digital converters is operated for a third time period. The third time period is greater than the second time period and a portion of the third time period is concurrent with the second time period. Still further, following the second time period and concurrently with a portion of the third time period, the at least one secondary sampling switch of the one of the N number of analog to digital converters is operated to transfer the charge on the hold capacitance to the at least one secondary hold capacitor of the one of the N number of analog to digital converters. The method further includes the step of successively repeating the aforesaid operating steps to obtain and process new sampled voltage values. For each successive repetition of operation of the sampling switch, the aforesaid operating steps are sequentially applied to a different one of the N number of analog to digital converters and following an Nth repetition, the sequence of the N number of analog to digital converters is repeated.

BRIEF DESCRIPTION OF THE DRAWINGS

FIG. 1 is a block diagram of a conventional parallel analog to digital converter system;

DESCRIPTION OF THE PREFERRED EMBODIMENTS

Referring to FIGS. 2-7, there is shown an analog to digital converting system 200 with a charge redistribution sampler. The system 200 is formed on a substrate that may form a distinct integrated circuit, a system on a chip (SOC) or other semiconductor technology. The analog to digital converting system 200 includes an analog to digital converter circuit that is formed by a plurality of parallel analog to digital converters (ADCs) for continuous sequential processing of input analog voltage signal samples. Each of the ADCs is a type of ADC that employs a capacitive digital to analog converter (DAC) therein, such as a successive approximation register based (SAR) ADC, a pipeline ADC, or variations thereof. The architecture and operation of SAR and pipeline ADCs are well known and therefore only those portions thereof that depart from known architectures and/or operation of SAR and pipeline ADCs will be discussed in detail herein.

Figure 1A:
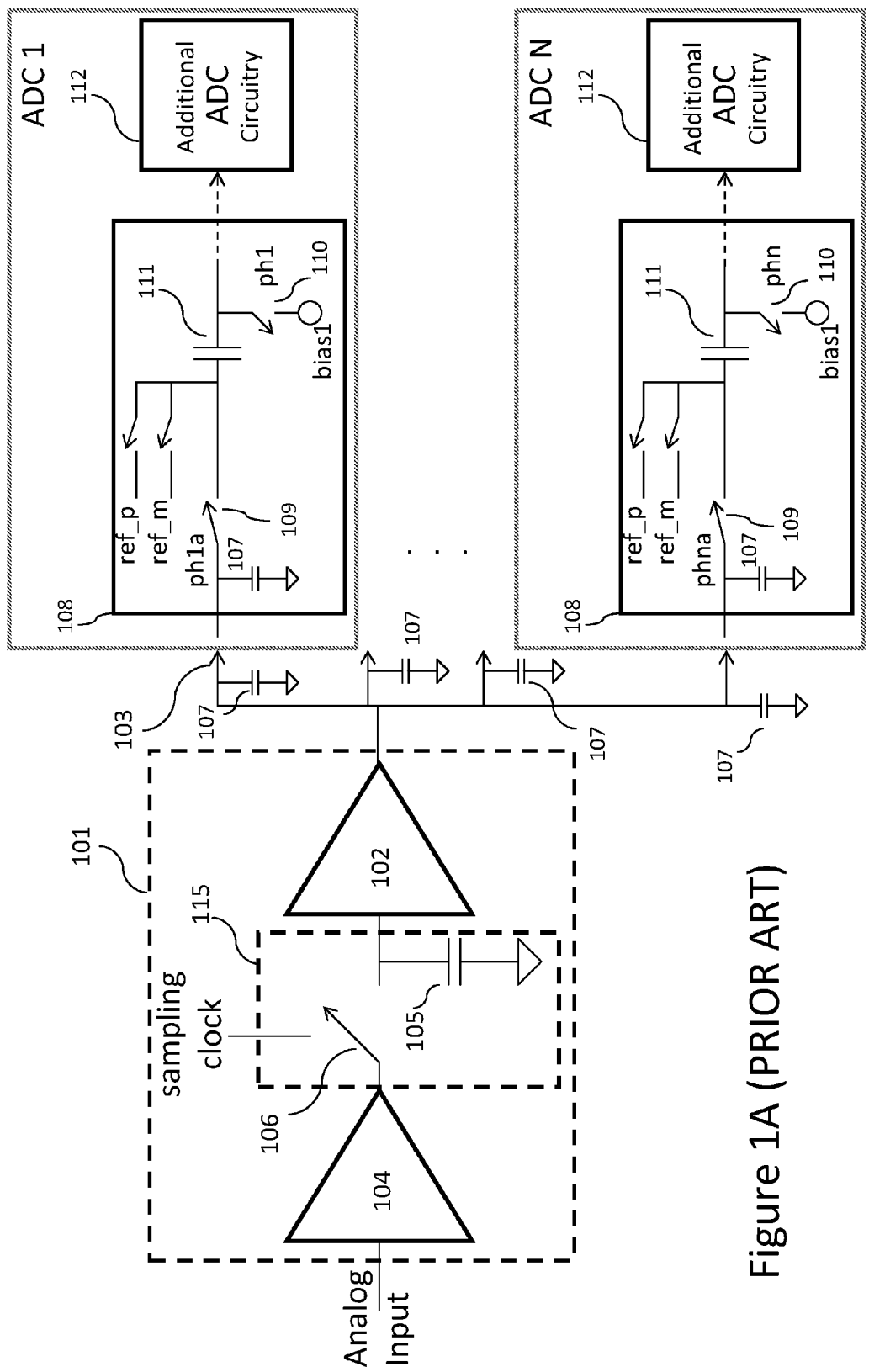
FIG. 1A is an illustration of the conventional parallel analog to digital converter system of FIG. 1 implemented as a time-interleaved parallel successive approximation register based analog to digital converter system.
Figure 1B:
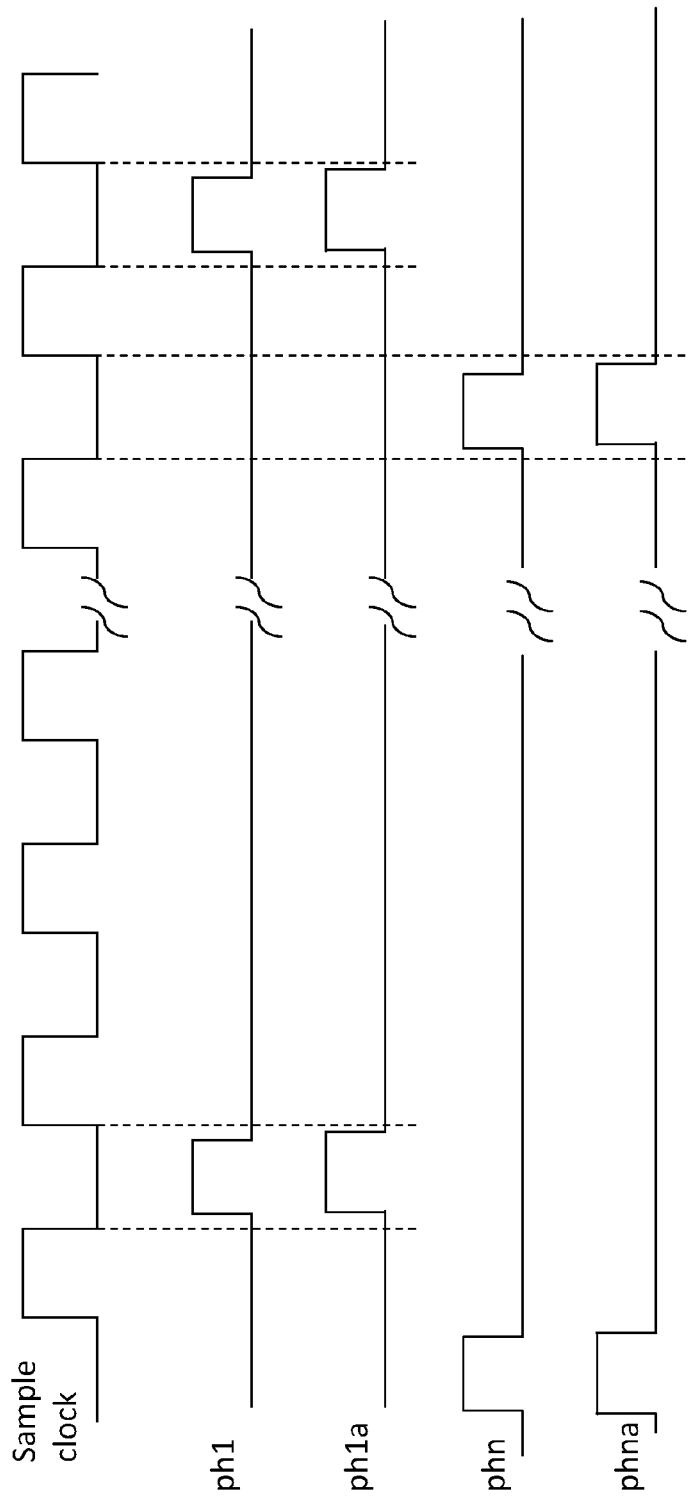
FIG. 1B is a timing diagram showing timing of operation of the sampler and initial operation of the capacitor digital to analog converter portion of an analog to digital converter of FIG. 1A.

The analog to digital converting system 200 further includes a sample and hold circuit 220 that includes a hold capacitance that is directly connected to the conductive interconnect wiring pattern 203 and a clock driven sampling switch 202 for high speed sampling of an input analog voltage signal. The sample and hold circuit 220 of the disclosed analog to digital converting system 200 is devoid to an output buffer circuit, as seen in the prior art systems (FIGS. 1 and 1A). There are a number of benefits derived by the elimination of the output buffer. By removing the output buffer from the sample and hold circuit 220, a large amount of power and integrated circuit area is saved. Additionally, the speed of using the disclosed charge redistribution sampler allows a faster parallel ADC to be built in comparison to the prior art approach shown in FIGS. 1 and 1A, since the settling time of the output buffer is no longer a constraint on the sampling speed, and the time required to design the ADC is reduced as well.

For medium resolution parallel ADCs, where the DAC capacitance is small and the matching requirements between the ADCs is moderate, the disclosed system and method provides the ability for a small parallel ADC circuit with low power, inherent sampling aperture matching between the parallel ADCs, good gain matching without any calibration, while allowing a very high sample rate for the analog to digital converting system 200. Working embodiments of the analog to digital converting system 200 disclosed herein have been designed using a submicron process of 28 nanometers and are presently in fabrication. Parallel ADCs with excellent matching between the capacitors of the multiple ADCs have been produced using sub-micron processes from 65 nanometers to below 40 nanometers, allowing production of accurate analog to digital converter circuits. Eliminating the output buffer of the sample and hold circuit 220 also removes distortion of the sampled voltage caused by the non linearity found in any voltage buffer and also removes the noise of the active circuitry in the output buffer. Further, the thermal noise of the sampling process is reduced. Absent the output buffer of the sample and hold circuit 220, the sampling noise is just the sampled noise on the sampling capacitor caused by the noise of the input buffer and the thermal noise (KTC noise) of the sampling switch and the KTC noise DAC capacitance of the parallel ADCs, which is captured when the reset switch in each of the parallel ADCs is opened.

Figure 2:
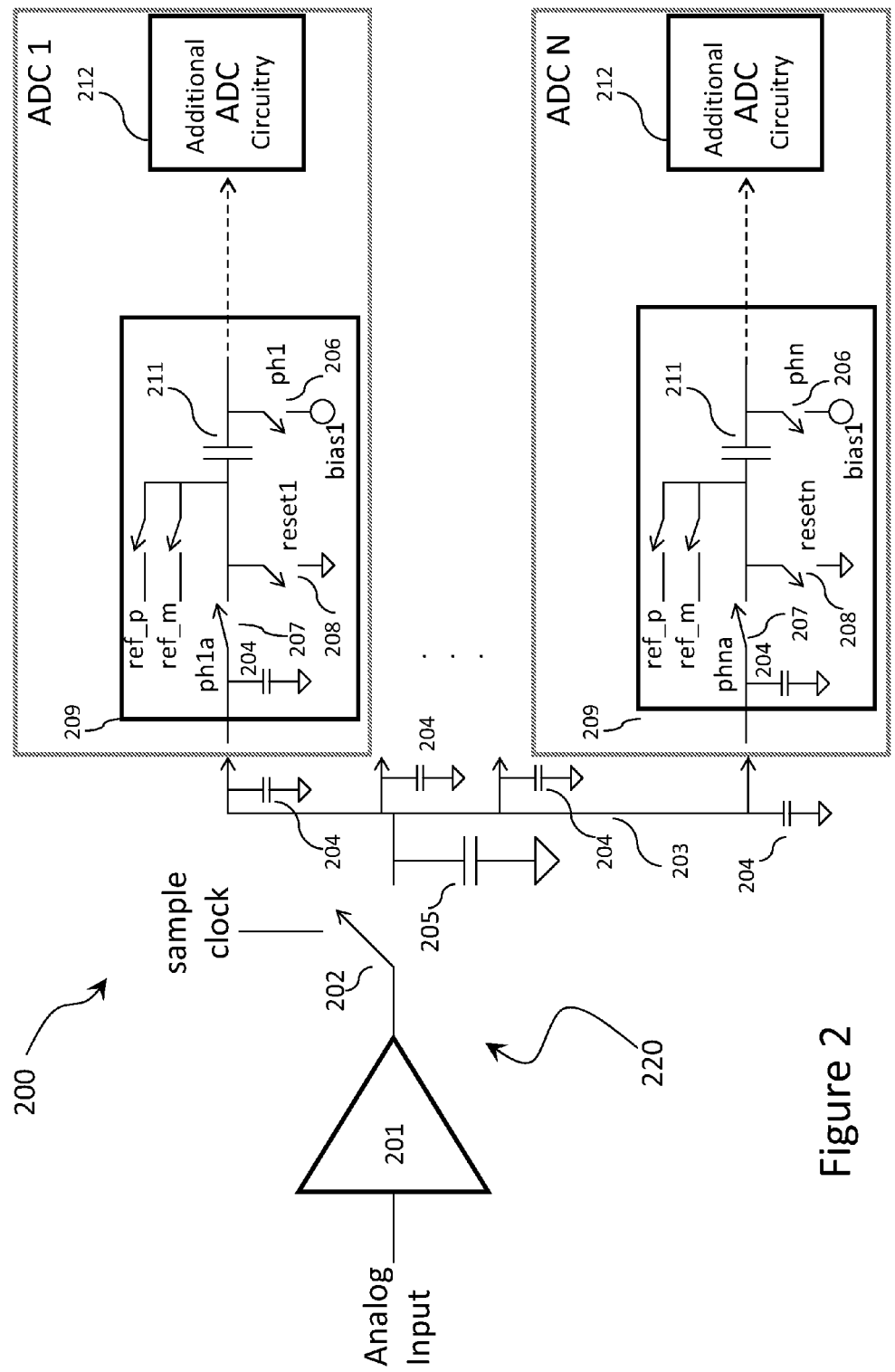
FIG. 2 is an illustration of an analog to digital converting system with a charge redistribution sampler of the present invention.

Referring more specifically to FIG. 2, a schematic illustration of an analog to digital converting system 200 with a charge redistribution sampler is shown. The system employs a plurality of ADCs connected in parallel to the conductive interconnect wiring pattern 203, represented in the diagram by the first of the plurality of ADCs, ADC 1, and the last of the plurality of ADCs, ADC N, N being an integer greater than 1. In FIG. 2, each of ADC 1-ADC N are an ADC type that use a capacitor DAC, such as an SAR or pipeline type ADC, of which the capacitor section 209 is a part thereof. As the architecture of capacitive DACs are well known, the drawing of FIG. 2 has been simplified so as to represent the capacitive network portion of the DAC in each of the illustrated ADCs by a single one of the multiple switched capacitor sections 209 that are actually incorporated in the DAC. It should be understood that each of the parallel ADCs includes multiples of the section 209, all connected to the conductive interconnect wiring pattern 203 and operated in unison with respect to the transfer of charge thereto. The additional ADC circuitry 212 is the conventional ADC circuitry associated with the particular type of ADC, SAR or pipeline, being used.

An analog signal that may be connected to the analog input is buffered by the input buffer 201, the output of which is connected to the common terminal of the sampling switch 202. Responsive to operation of the sampling switch 202, the input analog voltage signal is sampled onto the hold capacitance. The hold capacitance in the analog to digital converting system 200 is formed by the combination of the distinct hold capacitor 205 in parallel with the distributed parasitic capacitance 204 of the conductive interconnect wiring pattern 203 connecting the multiple parallel ADCs. Thus, rather than having to drive a sampled analog voltage signal through the capacitance of the interconnect wiring pattern, that capacitance becomes part of the hold capacitance and substantially obviates the problem normally associated with that parasitic capacitance 204. Since no active circuitry is involved other than switches, the transfer of this charge from the hold capacitance to the DAC capacitors in any of ADC 1-ADC N occurs very quickly at low power.

Although it is possible to use only the distributed parasitic capacitance 204 as the hold capacitance, and such is contemplated herein, there are advantages to using a larger capacitance value for the hold capacitance than would typically be obtained from the distributed parasitic capacitance 204. The gain matching between the different parallel ADCs will depend on the matching of the different DAC capacitors in all the parallel ADCs and also depend on the ratio of the hold capacitance to the DAC capacitor 211 in an ADC, in accordance with Equation 1 below.

$$\frac{\Delta G}{G} = \frac{\Delta C}{C} \frac{C}{C + C_{SH}} \quad (1)$$

Where G is the gain of the ADC, $C_{SH}$ is the total hold capacitance at the output of the sample and hold input buffer 201, and C is the local DAC capacitance within the ADC. As the hold capacitance $C_{SH}$ increases with respect to the DAC capacitance C in a parallel ADC, the matching requirement is eased between the DAC capacitors in the different parallel ADCs.

The tradeoff for increasing the hold capacitance is that as the sampling capacitance increases, the power of the input buffer 201 also increases in order to drive this capacitance with low distortion. However, countervailing benefits result from increasing the hold capacitance. As the hold capacitance increases, the attenuation caused by the redistribution of charge from the hold capacitor to the DAC capacitor is reduced which reduces the signal swing requirements on the input buffer 201. An additional benefit of a larger sampling capacitor is a reduced thermal noise due to KTC noise sampled onto the hold capacitor 205.

Figure 3:
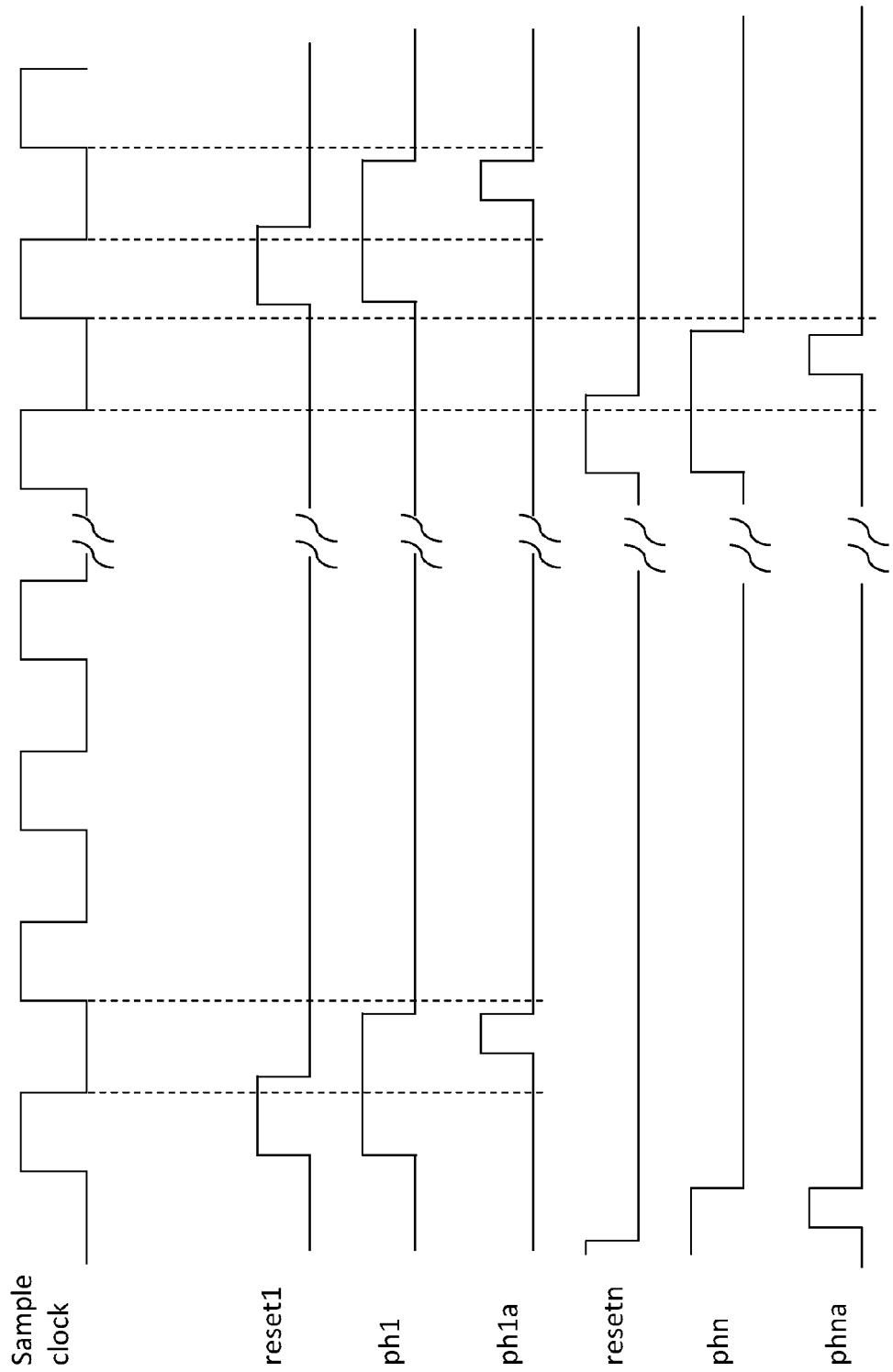
FIG. 3 is a timing diagram illustrating the signal timing for sample, hold and redistribution phases of the system of FIG. 2.

Referring additionally to FIG. 3, the operation of the analog to digital converting system 200 with respect to the redistribution of charge from the hold capacitance 205 and 204 will now be discussed. The Sampling switch 202 closes each time the sample clock rises to a high logic level in order to charge the hold capacitance 205 and 204 to a sampled voltage value corresponding to an analog voltage at the analog input. When the sample clock signal transitions to a logic low, the sampling switch 202 opens and the hold capacitance 205 and 204 stores the sampled voltage until it is redistributed to one of the ADCs ADC 1-ADC N. During the sampling period (when the sample clock is at a logic high level), the reset switch of the particular ADC that will be processing the sampled analog voltage value will close responsive to a reset control signal. That operation will not affect the charge being stored on the hold capacitance 205 and 204 since the secondary sampling switch 207 is in an "open" state during the sampling period.

To further understand the operation of the analog to digital converting system 200, assume that we are at the beginning of the sequence of parallel ADCs, the sampling switch 202 of sample and hold circuit 220 closes responsive to the sample clock rising to a high logic level to begin transferring charge to the hold capacitance 205 and 204. A short time into the sampling period, the reset switch 208 of ADC 1 closes responsive to the reset1 control signal. The delay from the start of the sampling period until the start of the reset control signal can extend into the hold period; however, as will be discussed in following paragraphs, certain advantages are derived from preparing the secondary hold capacitors for redistribution of charge from the hold capacitance during the sampling period. Substantially concurrently with the start of the reset1 control signal, the switch 206 closes responsive to the ph1 control signal which extends for a longer time period than the control signal reset1. Switch 208 connects one terminal (or plate) of the secondary hold capacitor 211 (a capacitor of the capacitor network of the DAC) to a reference potential of the system (ground potential). Switch 206 connects the opposing terminal (or plate) of the secondary hold capacitor 211 to a second reference potential, the bias1 supply. The bias1 supply voltage has a value such that the correct common mode voltage for the subsequent additional ADC circuitry 212 is ensured. Hence, during the overlapping time period when both switches 208 and 206 are closed, the secondary hold capacitor 211 is rapidly discharged. It should be remembered that the switched capacitor section 209 shown in the ADCs is just one of multiple sections in each ADC, each with an identical switching arrangement. Thus, each ADC includes multiple switches 206, 207 and 208 that respectively operate in unison. Accordingly, when the switches 208 and 206 are closed all of the capacitors in capacitor DAC in the particular ADC are discharged.

Figure 4:
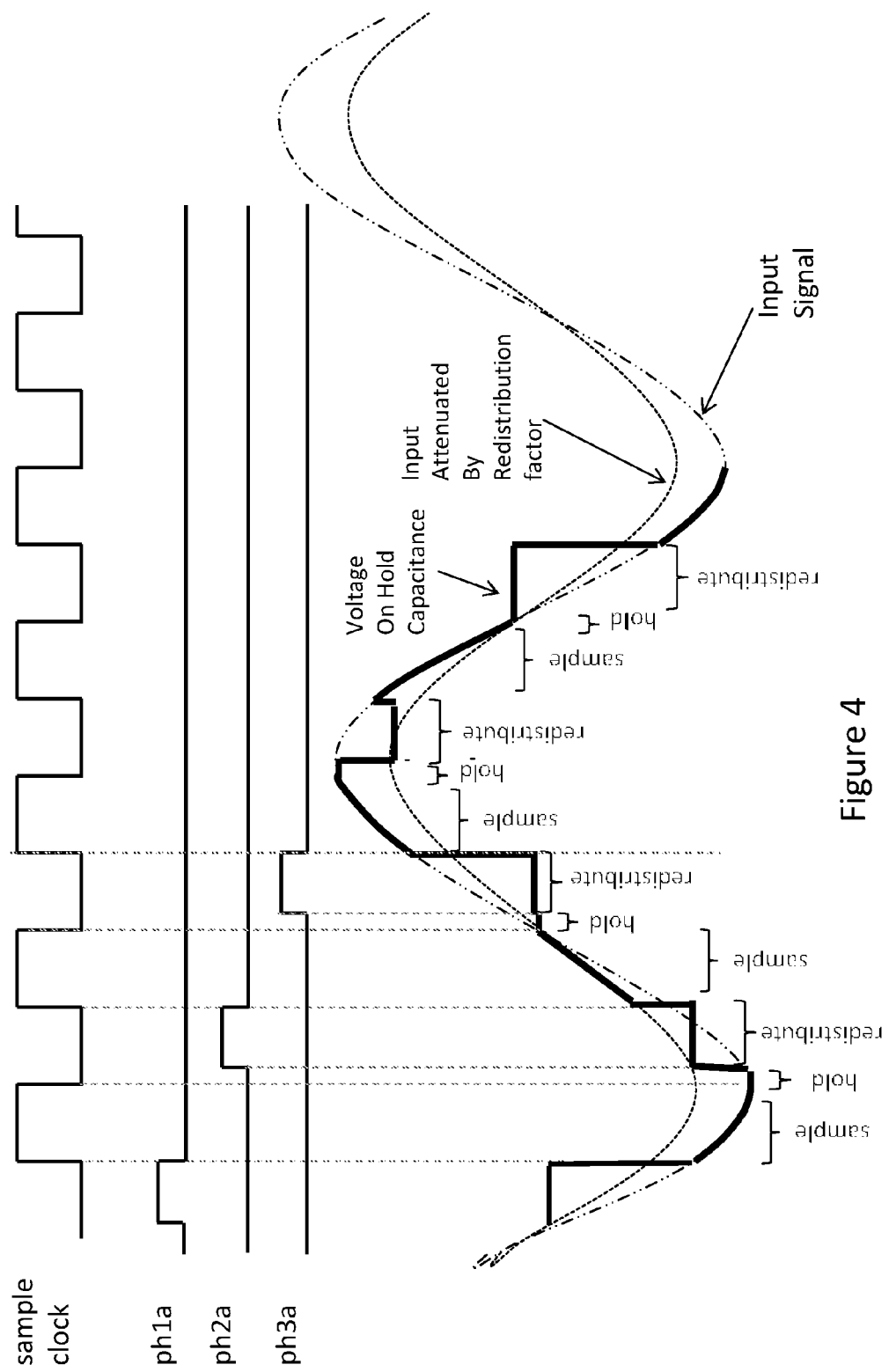
FIG. 4 is a timing diagram showing the input analog signal and sampled signal with charge redistribution and including the sample clock and charge transfer clock signals.

Following the time period of the reset1 control signal the switch 208 opens, switch 206 remains closed as the time period of control signal ph1 is greater than that of the reset1. Following the time period of the reset1 control signal, and during the hold period (when the sample clock is at a logic low level) the secondary sampling switch 207 closes, responsive to the charge transfer control signal ph1a, to redistribute charge from the hold capacitance 205 and 204 to the secondary hold capacitor 211, charging the capacitor 211 to the sampled voltage value held on the hold capacitance 205 and 204 less any loss do to the attenuation caused by charge redistribution between capacitors 205 and 204, and capacitors 211 in the capacitive DAC. The delay time period between the end of the reset control signal (reset1 in this case) and the start of the charge transfer control signal (ph1a for this example) need only be sufficiently long enough to ensure that reset switch 208 has opened before secondary sampling switch 207 closes. The time period of the ph1a charge transfer control signal is less than the time period of the ph1 control signal and overlaps a portion of the ph1 control signal, with both control signals terminating approximately at the same time and prior to the beginning of the next sample time period of the sample clock. The time period of ph1a is sufficiently long to allow the sampled voltage on the secondary hold capacitor 211 to equalize with hold capacitance 205 and 204 and can extend for almost the entire hold period, as illustrated in FIG. 4. The conventional ADC circuitry and timing then proceeds to process the sampled analog voltage value held on the secondary hold capacitor, closing the appropriate switch connecting one terminal of the capacitor 211 to the appropriate reference potential (ref_p, ref_m), with the opposing terminal coupled to the additional ADC circuitry 212, which circuitry is a function of the type of ADC being used in conjunction with the capacitor DAC. As is conventional, during the continued processing of one ADC, another sample and hold cycle proceeds for processing by the next successive ADC.

Each succeeding sample voltage transferred to the hold capacitance 205 and 204 during successive sample periods are correspondingly redistributed to a secondary hold capacitor 211 of the capacitor DAC sections 209 of another of the parallel ADCs in the identical manner described above. Following the start of the $N^{th}$ N sample period, the switches 208 and 206 of the switched capacitor section 209 of ADC N close responsive to the resetn and phn control signals (which signal timing is identical to the signals reset1 and ph1 described above) to discharge the secondary hold capacitor 211 (of each switched capacitor section 209) of ADC N. The discharge of the secondary hold capacitor 211 of ADC N is followed by the opening of switch 208 responsive to the cessation of the resetn control signal which is then followed by the operation of the secondary sampling switch 207 responsive to the phna charge transfer control signal. The closure of secondary sampling switch 207 responsive to the phna charge transfer control signal is preceded by the termination of the sampling period and the opening of the sampling switch 202 therewith. While the conventional ADC operation then proceeds for ADC N, the next successive sample period begins followed by a hold period wherein charge redistribution from the hold capacitance 205 and 204 to the secondary hold capacitors of ADC 1 repeats. The sequential processing described above repeats in a continuous process. As a result of discharging the secondary hold capacitors during a sample period, as opposed to the start of the hold period, the period of time for accomplishing the charge redistribution can be extended to almost the entire hold period of the sample and hold circuit 220 and further supports the high frequency operation of analog to digital converting system 200.

Figure 5:
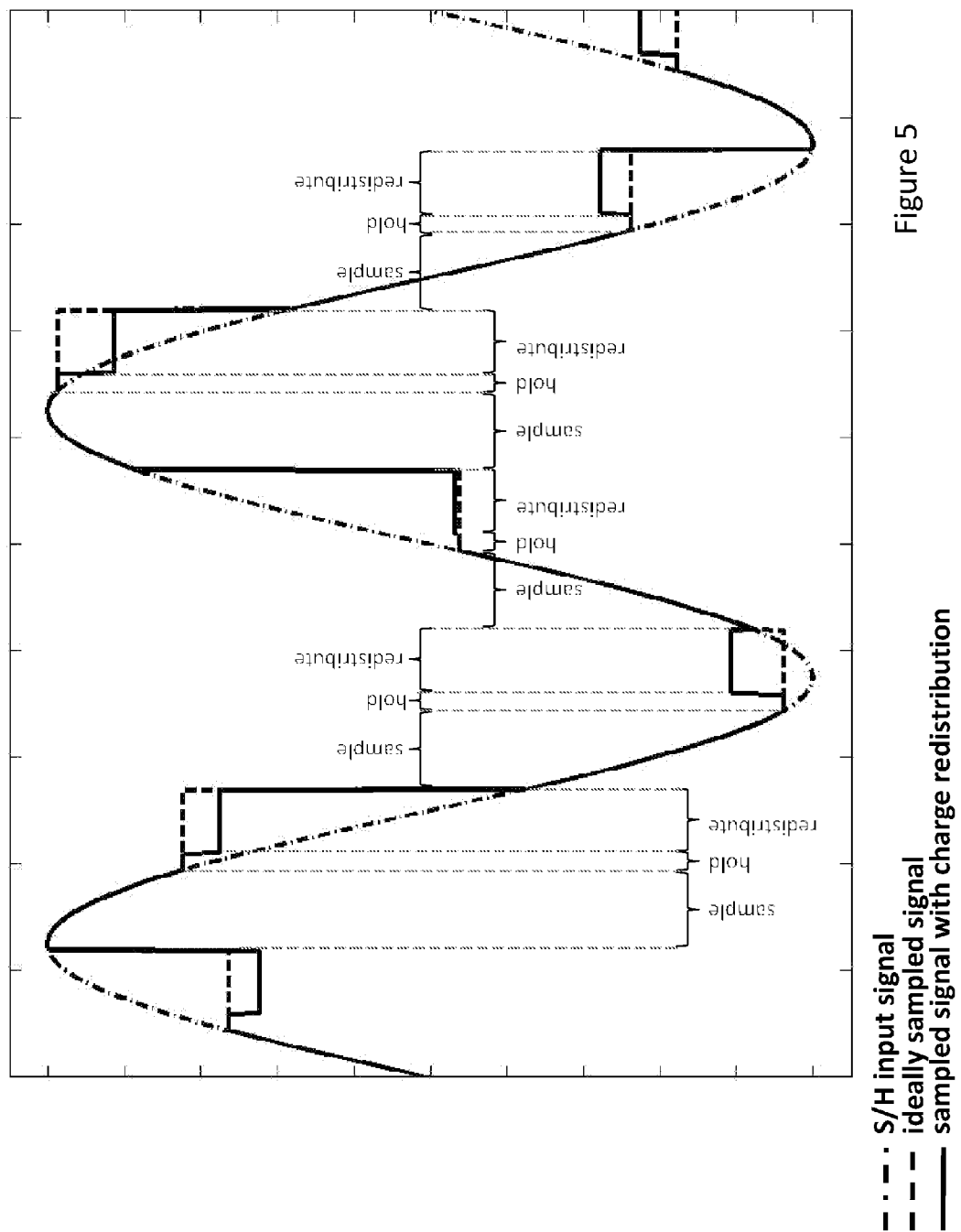
FIG. 5 is a diagram illustrating the input analog signal with comparisons of the sampled signal with charge redistribution and an ideally sampled signal.

Referring to FIGS. 4 and 5, there are shown diagrams showing the input analog signal and sampled signal with charge redistribution and timing thereof. FIG. 4 includes the sample clock, the charge transfer clock signals ph1$a$, ph2$a$, and ph3$a$, and the waveform on the hold capacitance. In FIG. 5, the analog input signal is compared with the sampled signal with charge redistribution and an ideally sampled signal. During the sample phase, the voltage on the hold capacitor tracks the input. During the reset phase, the capacitance (capacitors 211 of the multiple sections 209) of the capacitor DAC within a parallel ADC is discharged. During the redistribute phase, the charge on the hold capacitance 205 and 204 redistributes when the capacitors 211 in the capacitor DAC are switched in parallel with the hold capacitance 205 and 204 and the charge from the hold capacitance is transferred to the DAC capacitors, until the voltage is equalized. As can be seen in FIG. 4, the held voltage is reduced by the attenuation factor set by the ratio of the hold capacitance divided by the sum of the hold capacitance 205 and 204 plus the DAC capacitance 211. This attenuation will match very closely if the DAC capacitors match from one parallel ADC to another, thereby preserving the goal of close gain matching between ADCs. That attenuation is then accounted for in the full scale voltage specification of the analog to digital converting system 200.

Figure 6:
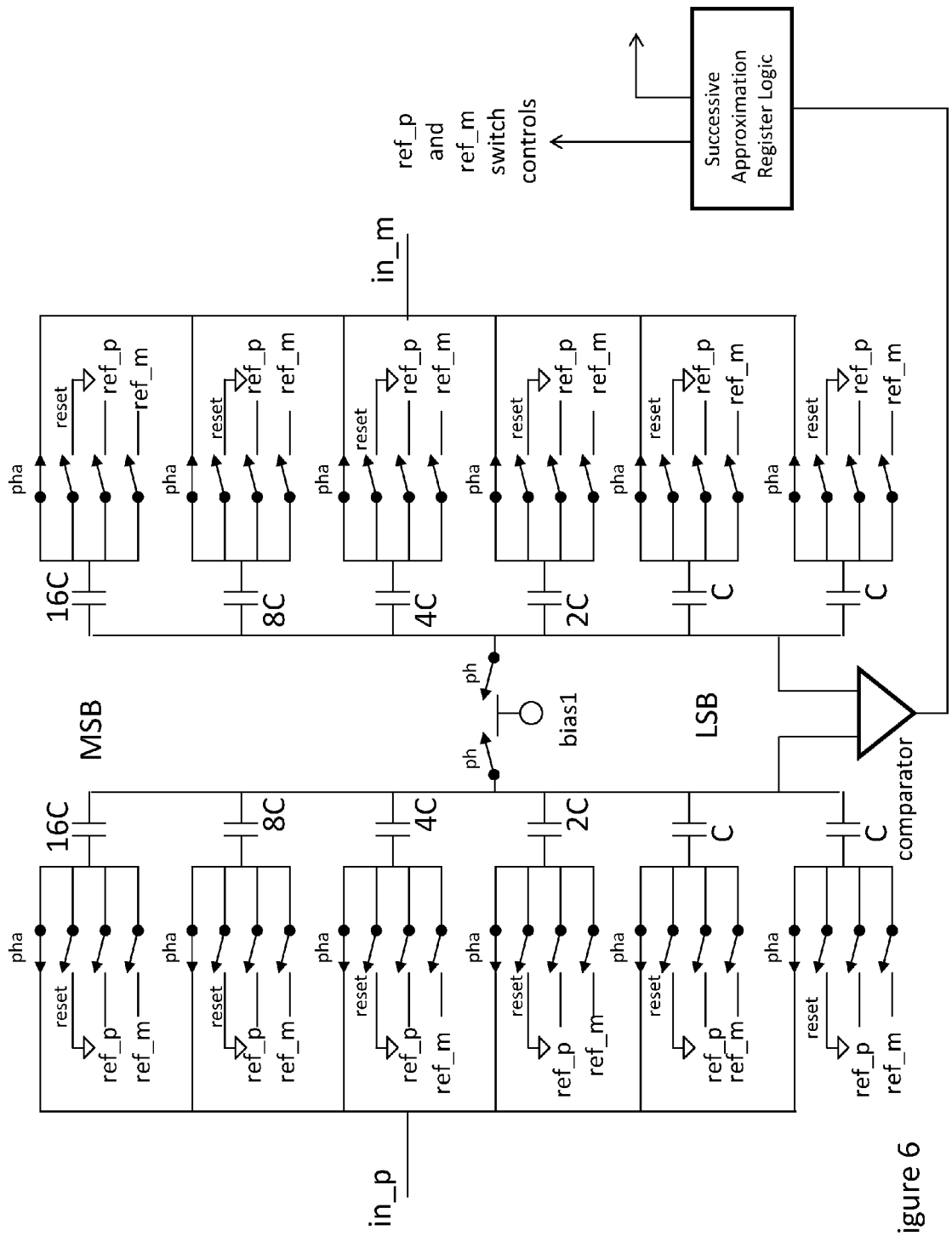
FIG. 6 a schematic diagram of a differential capacitor digital to analog converter of a 5 bit successive approximation analog to digital converter architecture of the present invention.

Turning now to FIG. 6, there is shown an example of a 5 bit successive approximation ADC architecture with a differential capacitor DAC. A multiplicity of reset switches, each corresponding to the switch 208 in FIG. 2, are provided within this capacitor DAC to discharge all of the DAC capacitors prior to the charge redistribution phase, as has been previously described. The multiplicity reset switches and the multiplicity of ph switches, each corresponding to switch 206 in FIG. 2, close to affect the discharge of the DAC capacitors. After the capacitors have been discharged, the reset switches are opened and the plurality of sample switches pha, each corresponding to switch 207 in FIG. 2, are closed to redistribute the charge between the hold capacitance 205 and 204 (shown in FIG. 2) and all of the DAC capacitors.

Once the charge has redistributed, the SAR converter then operates conventionally, setting the most significant bit (MSB) to a 1 and the remaining bits to a 0 (via the switches that couple the DAC capacitors to the reference voltages ref_p and ref_m), looking at the comparator output and either keeping the 1 for the MSB or setting the MSB to a 0 and then setting the MSB-1 to a 1 and repeating the process until all the bits have been determined. Different number of bits and other SAR architectures, such as architectures which use overlap bit or bits, can also be used with the charge redistribution scheme disclosed herein.

Figure 7:
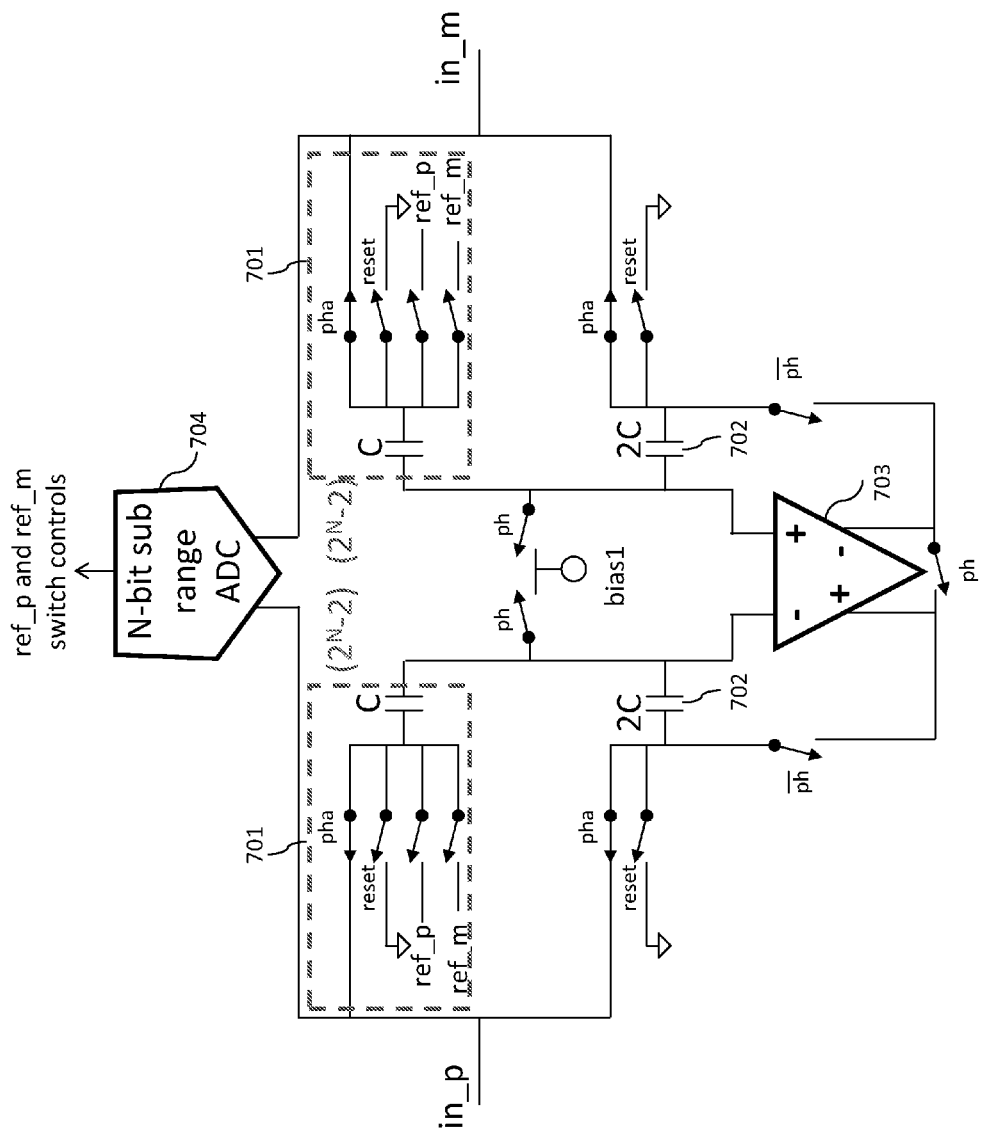
FIG. 7 is an illustration of an N-bit sub-range stage from a pipeline analog to digital converter architecture of the present invention.

The disclosed charge redistribution scheme is applicable and advantageous to any parallel ADC architecture that employs a capacitor DAC. Thus, pipeline type ADC architectures are also well suited for use with the disclosed charge redistribution scheme. In FIG. 7, there is shown an example of an N-bit sub-range stage from a pipeline ADC, which as in the SAR ADC example is one of a plurality of ADCs coupled to the sample and hold circuitry 220 by the conductive interconnect wiring pattern 203 with its distributed parasitic capacitance 204 (shown in FIG. 2). The circuit is shown in a differential implementation, but could be single ended as well. The architecture contains a sub-range capacitive DAC with $2^N-2$ identical switched capacitor structures 701 (only one switched capacitor structure 701 being shown for each half of the circuit for simplicity), where N equals the number of bits of resolution of the sub range stage of the ADC, and one "flip-over" capacitor 702 in each half of the circuit. Total capacitance is $2^NC$ plus the input capacitance of the sub-range ADC 704. Reset switches, each corresponding to the switch 208 in FIG. 2, are included within the sub-range capacitive DAC to discharge the capacitors before the input signal is sampled onto them. The reset switches and the ph switches, each corresponding to switch 206 in FIG. 2, close to affect the discharge of the DAC capacitors. After the capacitors are discharged, the reset switches are opened and the sample switches pha, each corresponding to switch 207 in FIG. 2, are closed and the charge stored in the hold capacitance 205 and 204 (shown in FIG. 2) is redistributed to the DAC capacitors and the "flip-over" capacitors. During this time the sub-range ADC 704 performs the coarse N-bit conversion of the input signal and the op-amp 703 is reset by the switches ph.

After the input signal is sampled onto the DAC capacitors and the sub-range ADC completes its conversion, the sample switches pha, each corresponding to switch 207 in FIG. 2, and switches ph, each corresponding to switch 206 in FIG. 2, open and the sub-range stage evaluates the residue voltage $$v_{out} = 2^{N-1}\left(v_{in} - K\frac{ref_p - ref_m}{2^N}\right),$$

where K is the sub-range ADC output, $K=-2^{N-1}+1, \ldots, 1, 0, 1, \ldots 2^{N-1}-1$. The residue voltage feeds the next sub-range stage in the pipeline ADC, as is conventional.

The disclosed charge redistribution scheme maintains the advantage of a common sampler in front of parallel ADCs while eliminating the difficult problem of buffering this sampled result and driving N number of parallel ADC converters. By using the disclosed charge redistribution approach, the output buffer amplifier is eliminated from the ADC system design. Also, the routing capacitance to the multiple ADCs becomes much less important in terms of any detrimental effects, so a low resistance charge distribution path defined by the conductive interconnect wiring pattern can be designed with far less regard for capacitance, since a large hold capacitance, significantly larger than the distributed parasitic capacitance, will be placed in parallel with the conductive interconnect wiring pattern. As a result of the resistance of the conductive interconnect wiring pattern being low, the speed of the charge redistribution can be very fast since it is only limited by the on resistance of the switches and the size of the DAC capacitance in the one ADC of the parallel ADCs to which the charge is being redistributed.

Another advantage of this invention is in a simplified design and physical layout time. The design can be laid out and simulated with a minimum of difficulty since once a low resistance interconnect has been laid out between the sampling capacitor and the parallel ADCs, the only design iteration often required is a capacitance extraction of that interconnect, so that the appropriate parallel hold capacitor can be placed in parallel to meet the KTC noise requirements of the input sampler. The design and simulation of the input buffer driving the target hold capacitance can be done independent of the ultimate load of the parallel ADCs with the conductive interconnect wiring pattern.

The descriptions above are intended to illustrate possible implementations of the present invention and are not restrictive. While this invention has been described in connection with specific forms and embodiments thereof, it will be appreciated that various modifications other than those discussed above may be resorted to without departing from the spirit or scope of the invention. Such variations, modifications, and alternatives will become apparent to the skilled artisan upon review of the disclosure. For example, functionally equivalent elements or method steps may be substituted for those specifically shown and described, and certain features may be used independently of other features, and in certain cases, particular locations of elements or sequence of method steps may be reversed or interposed, all without departing from the spirit or scope of the invention as defined in the appended Claims. The scope of the invention should therefore be determined with reference to the description above and the appended claims, along with their full range of equivalents.

What is claimed is:

1. An analog to digital converting system with a charge redistribution sampler, comprising:
    an analog to digital converter circuit including a plurality of analog to digital converters each incorporating a switched capacitor digital to analog converter;
    a conductive interconnect wiring pattern connecting inputs of said plurality of analog to digital converters in parallel, said conductive interconnect wiring pattern having a distributed parasitic capacitance; and
    a sample and hold circuit coupled to an input terminal for periodically sampling an analog voltage applied to said input terminal, said sample and hold circuit including a hold capacitor passively connected to said conductive interconnect wiring pattern and a sampling switch coupled between said input terminal and said hold capacitor, said sampling switch coupling an analog voltage at said input terminal to a hold capacitance responsive to a sampling clock signal and thereby charging said hold capacitance to a sampled voltage value corresponding to the analog voltage, said hold capacitance being formed by a combination of said hold capacitor of said sample and hold circuit and said distributed parasitic capacitance, said sampled voltage value held on said hold capacitance being secondarily sampled by said analog to digital converter circuit for conversion to a digital representation thereof.

2. The analog to digital converter with a charge redistribution sampler as defined in claim 1, where each of said analog to digital converters is a successive approximation analog to digital converter arranged for continuous successive conversion of multiple sequential samples of said analog voltage.

3. The analog to digital converter with a charge redistribution sampler as defined in claim 2, where each of said successive approximation analog to digital converters includes at least one secondary hold capacitor, at least one secondary sampling switch coupled between said conductive interconnect wiring pattern and said at least one secondary hold capacitor for transferring charge from said hold capacitance to said at least one secondary hold capacitor responsive to a secondary sampling clock signal delayed in time with respect to said sampling clock signal, and at least one reset switch coupled to said at least one secondary hold capacitor and operating to discharge said at least one secondary hold capacitor during a time period delayed in time with respect to said sampling clock signal and preceding said secondary sampling clock signal.

4. The analog to digital converter with a charge redistribution sampler as defined in claim 3, where each of said successive approximation analog to digital converters includes a differential capacitor digital to analog converter having a plurality of secondary sampling switches and a plurality of capacitors respectively coupled to said plurality of secondary sampling switches for transferring said charge from said hold capacitance thereto, said differential capacitor digital to analog converter including a plurality of reset switches respectively coupled to said plurality of capacitors for discharging all of said plurality of capacitors prior to said transfer of charge from said hold capacitance.

5. The analog to digital converter with a charge redistribution sampler as defined in claim 1, where each of said analog to digital converters is a pipeline analog to digital converter circuit.

6. The analog to digital converter with a charge redistribution sampler as defined in claim 5, where each said pipeline analog to digital converter circuit includes at least one secondary hold capacitor, at least one secondary sampling switch coupled between said conductive interconnect wiring pattern and said at least one secondary hold capacitor for transferring charge from said hold capacitance to said at least one secondary hold capacitor responsive to a secondary sampling clock signal delayed in time with respect to said sampling clock signal, and at least one reset switch coupled to said at least one secondary hold capacitor and operating to discharge said at least one secondary hold capacitor during a time period delayed in time with respect to said sampling clock signal and preceding said secondary sampling clock signal.

7. The analog to digital converter with a charge redistribution sampler as defined in claim 6, where each said pipeline analog to digital converter circuit includes a differential capacitor digital to analog converter having a plurality of secondary sampling switches and a plurality of capacitors respectively coupled to said plurality of secondary sampling switches for transferring said charge from said hold capacitance thereto, said differential capacitor digital to analog converter including a plurality of reset switches respectively coupled to said plurality of capacitors for discharging all of said plurality of capacitors prior to said transfer of charge from said hold capacitance.

8. The analog to digital converter with a charge redistribution sampler as defined in claim 3, where said hold capacitor and said at least one secondary hold capacitor of each of said plurality of successive approximation analog to digital converters are formed by like structures to provide gain matching among said plurality of successive approximation analog to digital converters.

9. The analog to digital converter with a charge redistribution sampler as defined in claim 8, where said hold capacitor and said at least one secondary hold capacitor of each of said plurality of successive approximation analog to digital converters are each formed by at least one metal finger capacitor.

10. The analog to digital converter with a charge redistribution sampler as defined in claim 1, where said hold capacitance has a value greater than a value of each of said at least one secondary hold capacitors to reduce a degree of gain matching requirement among the plurality of analog to digital converters.

11. A charge redistribution sampling method for a high speed analog to digital converter circuit, comprising:
  a) providing a sampling switch coupled to an analog signal input;
  b) providing an analog to digital converter circuit formed by a N number of analog to digital converters coupled in parallel to the sampling switch by a conductive interconnect wiring pattern, N being an integer greater than 1;
  c) forming a hold capacitance having at least one distinct capacitor passively connected to the conductive interconnect wiring pattern, the hold capacitance being formed by a parallel combination of the at least one distinct capacitor and a distributed parasitic capacitance of the conductive interconnect wiring pattern, the hold capacitance holding a sampled voltage value of the analog signal input;
  d) providing each of the analog to digital converters with at least one secondary sampling switch connected to the conductive interconnect wiring pattern;
  e) providing each of the analog to digital converters with at least one secondary hold capacitor connected to the at least one secondary sampling switch for secondarily sampling the sampled voltage value for conversion to a digital representation thereof;
  f) providing each of the analog to digital converters with at least one reset switch coupled between one terminal of the at least one secondary hold capacitor and a first reference voltage; and
  g) providing each of the analog to digital converters with at least one bias supply switch coupled between an opposing terminal of the at least one secondary hold capacitor and a second reference voltage.

12. A charge redistribution sampling method comprising:
  a) providing a sampling switch coupled to an analog signal input;
  b) providing an analog to digital converter circuit formed by a N number of analog to digital converters coupled in parallel to the sampling switch by a conductive interconnect wiring pattern, N being an integer greater than 1;
  c) forming a hold capacitance connected to the conductive interconnect wiring pattern, the hold capacitance being formed by a parallel combination of at least one distinct capacitor and a distributed parasitic capacitance of the conductive interconnect wiring pattern;
  d) providing each of the analog to digital converters with at least one secondary sampling switch connected to the conductive interconnect wiring pattern;
  e) providing each of the analog to digital converters with at least one secondary hold capacitor connected to the at least one secondary sampling switch;
  f) providing each of the analog to digital converters with at least one reset switch coupled between one terminal of the at least one secondary hold capacitor and a first reference voltage;
  g) providing each of the analog to digital converters with at least one bias supply switch coupled between an opposing terminal of the at least one secondary hold capacitor and a second reference voltage;
  h) operating the sampling switch during a first time period to connect the hold capacitance to the analog signal input to charge the hold capacitance to a sampled voltage value;
  i) operating the at least one reset switch of one of the N number of analog to digital converters for a second time period to discharge the at least one secondary hold capacitor;
  j) closing the at least one bias supply switch of the one of the N number of analog to digital converters substantially concurrently with the operation of the at least one reset switch, the at least one bias supply switch being closed for a third time period, the third time period being greater than the second time period;
  k) following the second time period and concurrently with a portion of the third time period operating the at least one secondary sampling switch of the one of the N number of analog to digital converters to transfer the charge on the hold capacitance to the at least one secondary hold capacitor of the one of the N number of analog to digital converters; and,
  l) successively repeating steps h through k to obtain and process new sampled voltage values, for each successive repetition of step h, steps i through k are sequentially applied to a different one of the N number of analog to digital converters and following an Nth repetition repeating the sequence of the N number of analog to digital converters for which steps i through k are sequentially applied.

13. The method of claim 11, where the step of providing each of the analog to digital converters with at least one bias supply switch includes the step of providing the second reference voltage with a value equal to the first reference voltage.

14. The method of claim 11, where the step of providing an analog to digital converter circuit formed by a N number of analog to digital converters includes the step of providing a N number of successive approximation analog to digital converters coupled in parallel to the conductive interconnect wiring pattern.

15. The method of claim 11, where the step of providing an analog to digital converter circuit formed by a N number of analog to digital converters includes the step of providing a N number of pipeline analog to digital converters coupled in parallel to the conductive interconnect wiring pattern.

16. The method of claim 11, where the step of forming a hold capacitance includes the step of selecting a capacitance value of the hold capacitance to be substantially greater than a capacitance value of each of the secondary hold capacitors.

17. The method of claim 16, where the step of selecting a capacitance value includes selecting a capacitance value of the hold capacitance to be approximately 5 to 10 times greater than the capacitance value of each of the secondary hold capacitors.

18. The method of claim 12, where the step of providing each of the analog to digital converters with at least one bias supply switch includes the step of providing the second reference voltage with a value equal to the first reference voltage.

19. The method of claim 12, where the step of providing an analog to digital converter circuit formed by a N number of analog to digital converters includes the step of providing a N number of successive approximation analog to digital converters coupled in parallel to the conductive interconnect wiring pattern.

20. The method of claim 12, where the step of providing an analog to digital converter circuit formed by a N number of analog to digital converters includes the step of providing a N number of pipeline analog to digital converters coupled in parallel to the conductive interconnect wiring pattern.

\* \* \* \* \*